United States Patent
Song et al.

(10) Patent No.: US 6,281,066 B1
(45) Date of Patent: Aug. 28, 2001

(54) METHOD OF MANUFACTURING A CAPACITOR IN A MEMORY DEVICE

(75) Inventors: Han Sang Song, Yongin-shi; Chan Lim, Ichon-shi, both of (KR)

(73) Assignee: Hyundai Electronics, Industries Co., Ltd., Ichon-Shi (KR)

( * ) Notice: Subject to any disclaimer, the term of this patent is extended or adjusted under 35 U.S.C. 154(b) by 0 days.

(21) Appl. No.: 09/466,912

(22) Filed: Dec. 20, 1999

(30) Foreign Application Priority Data

Dec. 22, 1998 (KR) .................................................. 98-57253

(51) Int. Cl.$^7$ .............................................. H01L 21/8242
(52) U.S. Cl. ........................ 438/240; 438/239; 438/241; 438/242; 438/250; 438/251; 438/252; 438/253; 438/254; 438/255; 438/256; 438/393; 438/394; 438/395; 438/396; 438/397; 438/398; 438/399
(58) Field of Search .............................. 438/3, 239–242, 438/250–256, 393–399

(56) References Cited

U.S. PATENT DOCUMENTS

| 5,380,673 | 1/1995 | Yang et al. . |
|---|---|---|
| 5,438,012 | 8/1995 | Kamiyama . |
| 5,459,345 | 10/1995 | Okudaira et al. . |
| 5,696,394 | 12/1997 | Jones, Jr. et al. . |
| 5,726,083 | 3/1998 | Takaishi . |
| 5,814,852 | * 9/1998 | Sandhu et al. ........................ 257/310 |
| 5,837,593 | * 11/1998 | Park et al. ............................ 438/396 |
| 5,841,186 | 11/1998 | Sun et al. . |
| 5,854,106 | 12/1998 | Wu . |
| 5,874,334 | 2/1999 | Jenq et al. . |
| 5,913,129 | 6/1999 | Wu et al. . |
| 5,994,181 | * 11/1999 | Hsieh et al. .......................... 438/239 |
| 6,083,789 | * 7/2000 | Huang et al. ......................... 438/254 |
| 6,146,937 | * 11/2000 | Hong ................................... 438/239 |
| 6,198,124 | * 3/2001 | Sandhu et al. ....................... 257/310 |

FOREIGN PATENT DOCUMENTS

| 1-222469 | 5/1989 | (JP) . |
|---|---|---|
| 3-136361 | 11/1991 | (JP) . |
| 4-056805 | 2/1992 | (JP) . |
| 05-082731 | 4/1993 | (JP) . |
| 06-037257 | 2/1994 | (JP) . |
| 08-153857 | 6/1996 | (JP) . |

* cited by examiner

*Primary Examiner*—John F. Niebling
*Assistant Examiner*—Jennifer M. Kennedy
(74) *Attorney, Agent, or Firm*—Pennie & Edmonds LLP

(57) ABSTRACT

There is disclosed a method of manufacturing a capacitor of a semiconductor device by which a CVD TiN film and a MOCVD TiN film, and a polysilicon film are sequentially stacked in forming an electrode on a $Ta_2O_5$ dielectric thin film. Therefore, it can prevent changes in thickness of the effective oxide film of the $Ta_2O_5$ capacitor against the characteristics of each of the CVD TiN film and the MOCVD TiN film, even after a rapid thermal process. It can also improve the step coverage, thus greatly improving the stability and reliability of the capacitor.

18 Claims, 2 Drawing Sheets

METHOD OF MANUFACTURING A CAPACITOR IN A MEMORY DEVICE

FIELD OF THE INVENTION

1. Field of the Invention

The present invention relates to a semiconductor memory device. In particular, the present invention relates to a method of manufacturing a capacitor of a high-integrated memory device using a tantalum oxide film ($Ta_2O_5$) as a dielectric.

2. Description of the Prior Art

Currently, the semiconductor memory device can be mainly classified into a read/write memory and a read only memory (ROM). In particularly, the read/write memory may be classified into a dynamic RAM (hereinafter called DRAM) and a static RAM. The DRAM is currently the highest integrated device, which is consisted of one unit cell composed of one transistor and one capacitor.

Meanwhile, as the integration degree of the memory device is advanced, the capacity of the memory has increased four times in three years. Currently, many studies have been focused on 256 Mb(mega bit) DRAM and 1 Gb (giga bit). However, as the integration degree of the DRAM becomes higher, the cell area functioning to read and write the electrical signal must be reduced to 0.5 $\mu m^2$ in case of 256 Mb. Also, the area of the capacitor that is one of the basic elements of the cell, must be reduced to 0.3 $\mu m^2$. Due to this reason, in case of a higher integrated device more than 256 Mb class, the technology used in the conventional semiconductor process has its limitation. In other words, if the capacitor is manufactured by using $SiO_2/Si_3N_4$ etc. of the conventional dielectric materials in manufacturing a 64 Mb DRAM even though the thickness of the thin film becomes thinner, the area in which the capacitor occupies must exceed 6 times the cell area in order to secure the necessary capacitance. Due to this reason as the capacitor can not be used as a flat shape, the sectional area has to be extended in other ways. Thus, various technologies to increase the sectional area, that is, to increase the surface area of the storage node of the capacitor such as a stack capacitor structure or a trench type capacitor structure or a semi-spherical type poly-silicon film, have been proposed so far.

However in case of the device more than 256 Mb class using $SiO_2/Si_3N_4$ group dielectric materials, the thickness of the device could not be further reduced in order to increase the capacitance. Also, if the structure of the device becomes complicated in order to increase the sectional area of the capacitor, it makes the manufacturing process complicated, thus increasing the manufacturing cost and lowering the throughput. Thus, it is extremely difficult that the conventional method is applied the DRAM more than 256 Mb class, by which a three dimensional cubic structure is formed to increase its sectional area for satisfying the storage static capacitance.

In order to solve these problems, a study has been made on $Ta_2O_5$ dielectric thin film so as to replace the $SiO_2/Si_3N_4$ group dielectric. However, the capacitance of the $Ta_2O_5$ dielectric thin film is at most 2–3 times compared to that of the $SiO_2/Si_3N_4$ group dielectric. Thus, in order that the $Ta_2O_5$ dielectric thin film can be applied to the DRAM more than 256 Mb class, its dielectric thin film has to be reduced at its minimum. In this case, there is a problem that the leak current is increased. That is, in case of the $Ta_2O_5$ thin film, it is said that the leak current characteristic of the $Ta_2O_5$ capacitor is good at its amorphous state, but the $Ta_2O_5$ thin film can not be used itself since its effective oxide film (Tox) is thick in thickness. Therefore, though a method of crystallizing the $Ta_2O_5$ thin film at high temperature may be used so as to reduce the effective oxide film (Tox), there is a problem that the value of the leak current of the $Ta_2O_5$ capacitor is increased.

Meanwhile, the technology for manufacturing the capacitor using $Ta_2O_5$ is advantageous in securing a given static capacitance due to its high dielectric constant. However, it must use only TiN as an upper electrode material or a TiN/poly-silicon double structure, in order to prohibit the interface reactance of $Ta_2O_5$ with an upper electrode and a lower electrode and to prevent deterioration of its capacitance characteristic. Further, the lower electrode must use poly-silicon to the surface of which RTN (rapid thermal nitration) is processed.

However the conventional $Ta_2O_5$ capacitor constructed above may cause deterioration in the electrical characteristic such as an increase of the effective oxide film (Tox), an increase of the leak current etc. upon a high thermal process. Also, it may cause a problem of the step coverage due to a higher integration of the device. Thus, a lot of studies have been made on solving these problems.

SUMMARY OF THE INVENTION

It is an object of the present invention to solve the problems involved in the prior art, and to provide a method of manufacturing a capacitor of a semiconductor memory device, which can improve the step coverage of the electrode while preventing deterioration of the electrical characteristic due to a subsequent thermal process.

In order to accomplish the above object, the method of manufacturing a method of manufacturing a capacitor of a memory device according to the present invention comprises a method of manufacturing a capacitor of a memory device comprises forming a lower electrode; forming a tantalum oxide film of a dielectric thin film on lower electrode; forming a CVD TiN layer on the tantalum oxide film; forming a MOCVD TiN layer on the CVD TiN layer: and forming a poly-silicon layer on the MOCVD TiN layer whereby an upper electrode in which said CVD TiN layer, said MOCVD TiN layer and said poly-silicon layer arc stacked is formed.

In the present method, the step of forming the lower electrode includes forming a poly-silicon layer on a substrate, forming a MOCVD TiN layer on the poly-silicon layer and the a CVD TiN layer on the MOCVD TiN.

BRIEF DESCRIPTION OF THE DRAWINGS

The above object, and other features and advantages of the present invention will become more apparent by describing the preferred embodiment thereof with reference to the accompanying drawings, in which.

DETAILED DESCRIPTION OF PREFERRED EMBODIMENT

Figure 1:
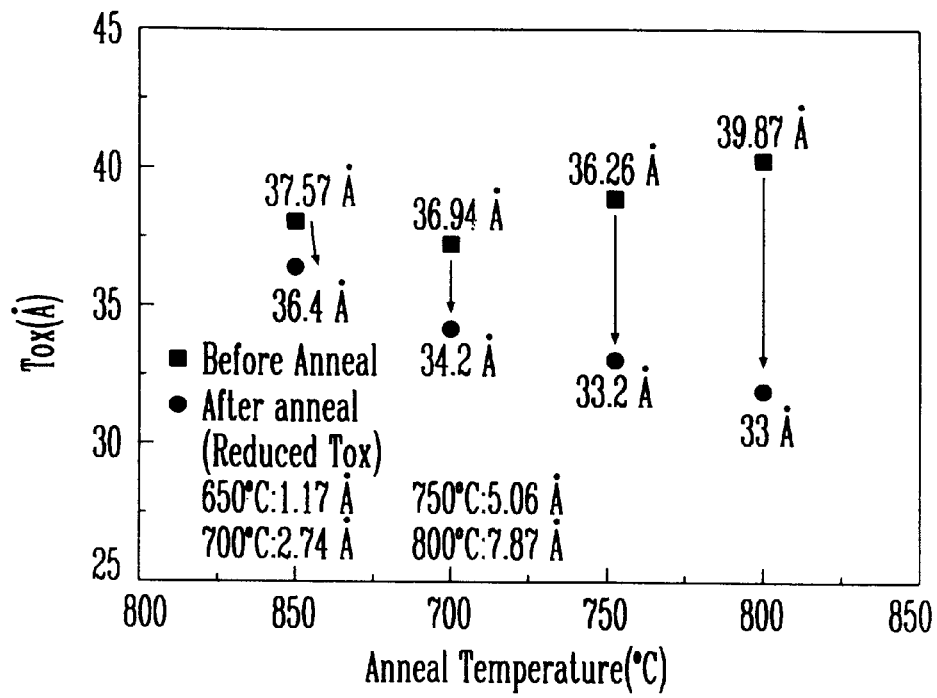
FIGS. 1 and 2 are the graphs for showing the changes in thickness of the effective oxide film (Tox) of the $Ta_2O_5$ according to a subsequent annealing process when MOCVD TiN and CVD TiN are each applied to upper electrodes.
Figure 2:
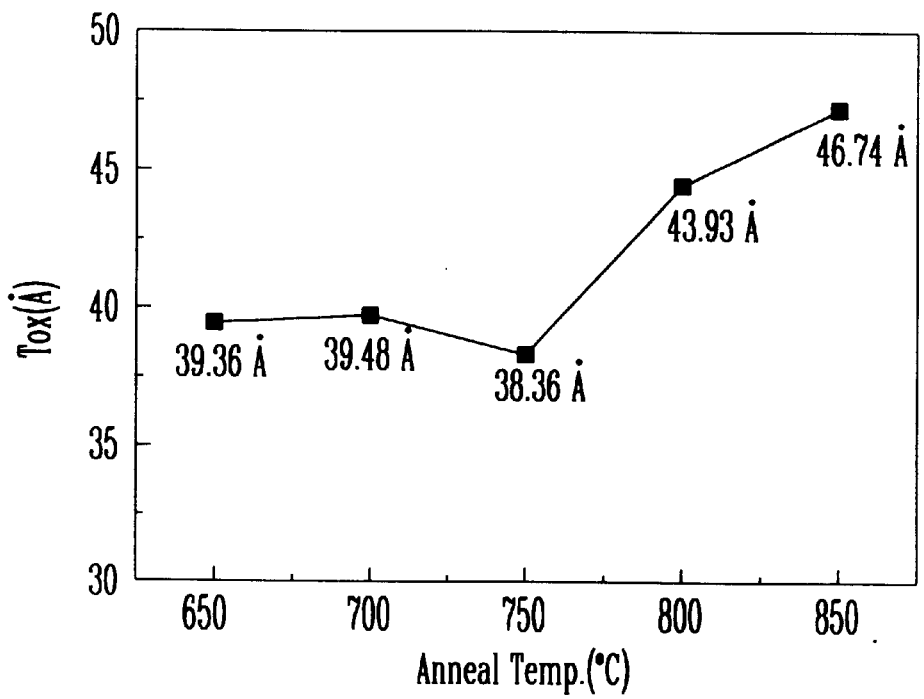

TiN can be deposited by chemical vapor deposition (CVD), which can be further divided into TiN by a MOCVD (metal organic CVD) method (hereinafter called "MOCVD TiN") and CVD TIN depending on its raw material used. FIGS. 1 and 2 are the graphs for showing the changes in thickness of the effective oxide film (Tox) of the $Ta_2O_5$ according to a subsequent annealing process when MOCVD TiN and CVD TiN are each applied to upper electrodes.

Referring now to FIG. 1. MOCVD TiN which uses TDMAT[$Ti(N(CH_3)_2)_4$] as a raw material does not allow oxygen within $Ta_2O_5$ thin film to diffuse into the interface of TiN and poly-silicon upon a subsequent thermal process. On the contrary, as it is absorbed into the TiN film, the thickness of the effective oxide film is reduced due to increase of the dielectric constant of the $Ta_2O_5$ film depending on a subsequent thermal process.

Referring to FIG. 2, though CVD TiN using $TiCl_4$ as a raw material has a good step coverage compared to MOCVD TiN, it does not prevent oxygen from diffusing into the $Ta_2O_5$ film. Thus, due to the oxide film generated at the $Ta_2O_5$/TiN interface, the thickness of the effective oxide film of $Ta_2O_5$ becomes thicker. If CVD TiN is used instead, the thickness of the effective oxide film (Tox) depending on the temperature of the thermal process shows that it does not change in the range of temperature up to about 750° C., but if the temperature becomes higher it does increase.

The present invention is to manufacture a capacitor so that it can maintain the thickness of the effective oxide film of $Ta_2O_5$ and it will have an improved step coverage, even after a subsequent flattening process, by using the characteristic of each of MOCVD TiN and CVD TiN.

Figure 3:
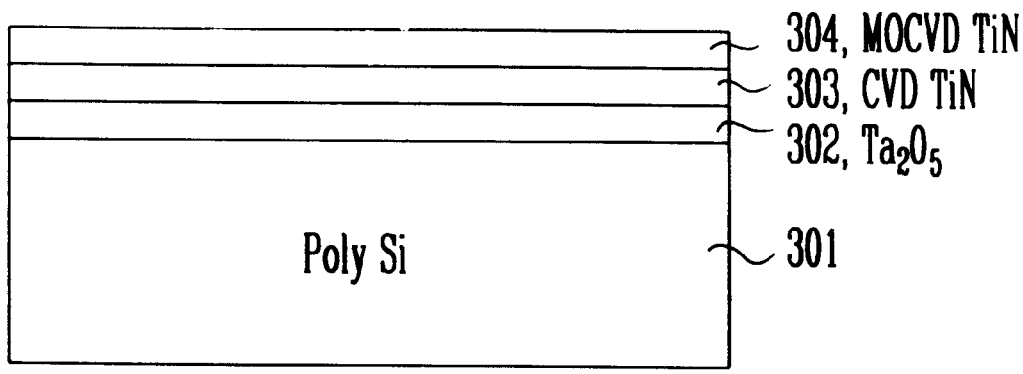
FIG. 3 is the sectional view for illustrating the structure of the upper electrode according to one embodiment of the present invention.

FIG. 3 is a sectional view of the capacitor structure according to one embodiment of the present invention. Referring to FIG. 3, the capacitor according to one embodiment of the present invention has a stacked structure in which a poly-silicon film 301 is formed as a lower electrode having a surface processed by RTN, a $Ta_2O_5$ film 302 as a dielectric thin film, a CVD TiN film 303 and a MOCVD TiN film 304 are sequentially stacked from bottom to top. On the MOCVD TiN film 304 may be further formed poly-silicon that is doped as an upper electrode material.

First, a poly-silicon film 301 is deposited as the lower electrode of $Ta_2O_5$ capacitor and the surface of the poly-silicon film 301 is then processed by RTN. The RTN is performed using $NH_3$ gas at the temperature of 750° C. through 900° C. Then, the $Ta_2O_5$ film 302 as a dielectric thin film is deposited by LPCVD method. At this time, in the method, a tantalum etoxide, $Ta(C_2H_5O_5)$, is used as a raw material, $N_2$ and $O_2$ are used as a carrier gas of reactive material and oxidizer, respectively, the flow of the $N_2$ and $O_2$ gas are maintained at 350 sccm through 450 sccm and 20 sccm through 50 sccm, respectively, the pressure within the reactive furnace is maintained 0.1 Torr through 0.6 Torr, and the substrate is maintained at the temperature of 350° C. through 450° C.

Next, a $N_2O$ plasma anneal process is performed at 300° C. through 500° C. to remove impurities within the $Ta_2O_5$ film 302 and then to fill depletion of oxygen. Then, a $N_2O$ furnace anneal process is performed at 750° C. through 900° C. to crystallize the $Ta_2O_5$ film 302.

Thereafter, the CVD TiN film 303 is deposited at 200 Å through 500 Å, wherein $TiCl_4$ is used as a raw material and $NH_3$ is used as a reactive gas. Also, the flow of the raw material and the reactive gas is about 10 sccm through 1000 sccm, the pressure within the reactive furnace is maintained at 0.1 Torr through 2 Torr and the temperature of the substrate is maintained at 300° C. through 500° C.

Then, the MOCVD TiN film 304 is deposited at 400 Å through 800 Å, wherein TDMAT[$Ti(N(CH_3)_2)_4$] is used as a raw material, $NH_3$ is used as a reactive gas, and He and Ar is used as a carrier gas. Also, the flow of the raw material is 200 sccm through 500 sccm, the flow of He and Ar of the carrier gases is 100 sccm through 300 sccm, respectively, the pressure within the reactive furnace is maintained at 2 Torr through 10 Torr, and the temperature of the substance is maintained at 300° C. through 500° C.

Next, a plasma process is performed at the power of 500 Watt through 1000 Watt during 20 seconds through 50 seconds. Then, a MOCVD TiN deposition process and a plasma process may be performed 2 times through 3 times repeatedly.

Thereafter, the poly-silicon film doped on the MOCVD TiN is deposited at 800 Å through 1200 Å and then a thermal process is performed at the temperature of 650° C. through 850° C.

Figure 4:
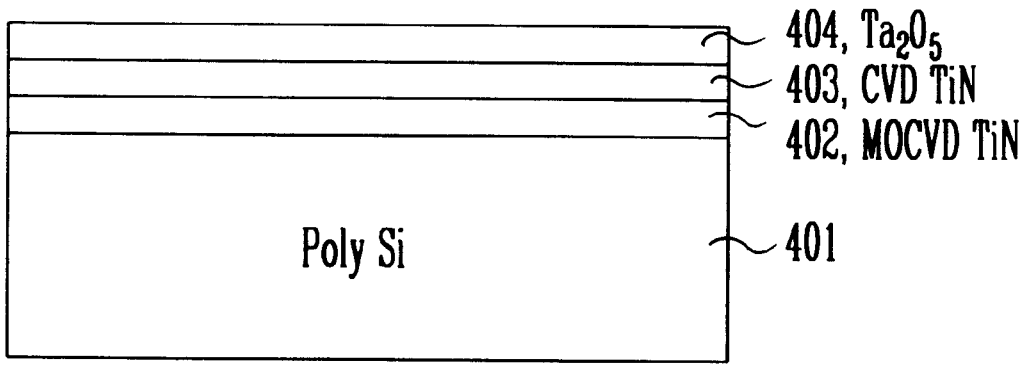
FIG. 4 is the sectional view for illustrating the structure of the lower electrode according to another embodiment of the present invention.

FIG. 4 is a sectional view for showing a capacitor structure according to another embodiment of the present invention. Referring to FIG. 4, the capacitor according to another embodiment of the present invention includes a poly-silicon film 401, a MOCVD TiN film 402 and a CVD TiN film 403 as a lower electrode. At this time, the surface of the poly-silicon film 401 may not be processed by RTN. On the CVD TiN film 403 is formed a $Ta_2O_5$ film 404 as a dielectric thin film. Meanwhile, though not shown in FIG. 4, the upper electrode, as in one embodiment of the present invention, may have a structure in which the CVD TiN film (303 in FIG. 3) and the MOCVD TiN film (304 in FIG. 3) are sequentially stacked. Also, on the MOCVD TiN film (304 in FIG. 3) of the upper electrode can be further formed a poly-silicon that is doped as an upper electrode materials.

The method of manufacturing the capacitor having the structure of FIG. 4 will be explained below.

First, a poly-silicon film 401 is deposited as the lower electrode of the capacitor and the MOCVD) TiN film 402 is deposited at 400 Å through 800 Å. [DMAT($Ti(N(CH_3)_2)_4$)] is used as a raw material, and He and Ar are used as carrier gases. Also, the flow of the raw material is 200 sccm through 500 sccm, and the flow of carrier gases, He and Ar is 100 sccm through 300 sccm. Then, a plasma process is performed with the power of 500 Watt through 1000 Watt during about 20 seconds through 50 seconds. Next, a MOCVD TiN deposition process and a plasma process may be performed 2 times through 3 times repeatedly.

Then, the CVD TiN film 403 is deposited on the MOCVD TiN film 402 at 200 Å through 500 Å, wherein $TiCl_4$ is used as a raw material and $NH_3$ is used as a reactive gas. Also, the flow of the raw material and the reactive gas is about 10 sccm though 1000 sccm, the pressure within the reactive furnace is maintained at 0.1 Torr though 2 Torr and the temperature of the substrate is maintained at 300° C. through 500° C.

Next, the $Ta_2O_5$ film 404 is deposited by LPCVD method. At this time, a tantalum etoxide, $[TA(C_2H_5O_5)]$ is used as a raw material, $N_2$ and $O_2$ are used as a carrier gas of reactive materials and oxidizer, respectively, the flow of the $N_2$ and $O_2$ gases are maintained at 350 sccm through 450 sccm and 20 sccm through 50 sccm, respectively, the pressure within the reactive furnace is maintained 0.1 Torr though 0.6 Torr, and the substrate temperature is maintained at 350° C. through 450° C.

Next, a $N_2O$ plasma anneal process is performed at the temperature of 300° C. through 500° C. to remove impurities within the $Ta_2O_5$ film 404, and then a $N_2O$ furnace anneal process is performed at 750° C. through 900° C. to crystallize $Ta_2O_5$.

As described above, the present invention is characterized in that it forms a capacitor by stacking a CVD TiN film and a MOCVD TiN film, and a poly-silicon film sequentially, in forming an electrode on the $Ta_2O_5$ dielectric thin film. Thus, by applying this method, the present invention can manufacture the shape of the capacitor into a cylinder type, pin type and also can apply the capacitor structure using a semi-spherical poly-silicon.

While the present invention has been described and illustrated herein with reference to the preferred embodiment thereof, it will be understood by those skilled in the art that various changes in form and details may be made therein without departing from the spirit and scope of the invention.

The present invention relates to a method of forming an electrode by stacking a CVD TiN film and a MOCVD TiN film, and a poly-silicon film sequentially. It can prevent changes in thickness of the effective oxide film of the $Ta_2O_5$ capacitor against the characteristics of each of the CVD TiN film and the MOCVD TiN film, even after a rapid thermal process. It can also improve the step coverage, thus greatly improving the stability and reliability of the capacitor.

What is claimed is:

1. A method of manufacturing a capacitor of a memory device, comprising the steps of:
    forming a lower electrode;
    forming a tantalum oxide film on said lower electrode;
    forming a CVD TiN layer on said tantalum oxide film;
    forming a MOCVD TiN layer on said CVD TiN layer in a separate step; and
    forming a poly-silicon layer on said MOCVD TiN layer;
    whereby an upper electrode having said CVD TiN layer, said MOCVD TiN layer and poly-silicon layer is formed.

2. The method of manufacturing a capacitor of a memory device as claimed in claim 1, wherein said lower electrode is formed by forming a poly-silicon layer on a substrate, a MOCVD TiN layer on said poly-silicon layer and a CVD TiN layer on said MOCVD TiN layer.

3. The method of manufacturing a capacitor of a memory device as claimed in claim 2, wherein said CVD TiN layer uses $TiCl_4$ as a raw material and $NH_3$ as a reactive gas, wherein the temperature of the substrate is maintained at 300° C. through 500° C.

4. The method of manufacturing a capacitor of a memory device as claimed in claim 3, wherein the flow of said $TiCl_4$ material and said $NH_3$ gas is 10 sccm through 1000 sccm and said CVD TiN layer is formed in thickness of 200 Å through 500 Å.

5. The method of manufacturing a capacitor of a memory device as claimed in claim 2, wherein said MOCVD TiN layer uses TDMAT as a raw material and uses He and Ar as carrier gases, the pressure within the reactive furnace is 2 Torr through 10 Torr, and the temperature of the substrate is maintained at 300° C. through 500° C.

6. The method of manufacturing a capacitor of a memory device as claimed in claim 5, wherein the flow of said TDMAT material is maintained at 200 sccm through 500 sccm, the flow of said He and Ar gases is 100 sccm through 300 sccm, and said MOCVD TiN layer is form at thickness of 400 Å through 500 Å.

7. The method of manufacturing a capacitor of a memory device as claimed in claim 2, wherein said MOCVD TiN layer is processed by a plasma with the power of 500 Watt through 1000 Watt during 20 seconds through 50 seconds after said MOCVD TiN layer is deposited.

8. The method of manufacturing a capacitor of a memory device as claimed in claim 2, wherein said plasma process is performed at least twice repeatedly.

9. The method of manufacturing a capacitor of a memory device as claimed in claim 1, wherein said lower electrode is formed by depositing a poly-silicon layer on a substrate and then processing a surface of the poly-silicon layer by RTN.

10. The method of manufacturing a capacitor of a memory device as claimed in claim 1, wherein said CVD TiN layer uses $TiCl_4$ as a raw material and $NH_3$ as a reactive gas, wherein the temperature of the substrate is maintained at 300° C. through 500° C.

11. The method of manufacturing a capacitor of a memory device as claimed in claim 10, wherein the flow of said $TiCl_4$ material and said $NH_3$ gas is 10 sccm through 1000 sccm and said CVD TiN layer is formed in thickness of 200 Å through 500 Å.

12. The method of manufacturing a capacitor of a memory device as claimed in claim 1, wherein said MOCVD TiN layer uses TDMAT as a raw material and uses He and Ar as carrier gases, the pressure within the reactive furnace is 2 Torr through 10 Torr, and the temperature of the substrate is maintained at 300° C. through 500° C.

13. The method of manufacturing a capacitor of a memory device as claimed in claim 12, wherein the flow of said TDMAT material is maintained at 200 sccm through 500 sccm, the flow of said He and Ar gases is 100 sccm through 300 sccm, and said MOCVD TiN layer is form at thickness of 400 Å through 500 Å.

14. The method of manufacturing a capacitor of a memory device as claimed in claim 1, wherein said MOCVD TiN layer is processed by a plasma with the power of 500 Watt through 1000 Watt during 20 seconds through 50 seconds after said MOCVD TiN layer is deposited.

15. The method of manufacturing a capacitor of a memory device as claimed in claim 1, wherein said plasma process is performed at least twice repeatedly.

16. A method of manufacturing a capacitor of a memory device, comprising the steps of:

forming a lower electrode;

forming a tantalum oxide film on said lower electrode;

forming a CVD TiN layer on said tantalum oxide film;

forming a MOCVD TiN layer on said CVD TiN layer; and forming a poly-silicon layer on said MOCVD TiN layer;

whereby an upper electrode having said CVD TiN layer, said MOCVD TiN layer and said poly-silicon layer is formed;

wherein said lower electrode is formed by forming a poly-silicon layer on a substrate, a MOCVD TiN layer on said poly-silicon layer and a CVD TiN layer on said MOCVD TiN layer.

17. A method of manufacturing a capacitor of a memory device, comprising the steps of:

forming a lower electrode;

forming a tantalum oxide film on said lower electrode;

forming a CVD TiN layer on said tantalum oxide film;

forming a MOCVD TiN layer on said CVD TiN layer; and forming a poly-silicon layer on said MOCVD TiN layer;

whereby an upper electrode having said CVD TiN layer, said MOCVD TiN layer and said poly-silicon layer is formed;

wherein said CVD TiN layer uses $TiCl_4$ as a raw material and $NH_3$ as a reactive gas, wherein the temperature of the substrate is maintained at 300° C. through 500° C.

18. The method of manufacturing a capacitor of a memory device as claimed in claim 17, wherein the flow of said $TiCl_4$ material and said $NH_3$ gas is 10 sccm through 1000 sccm and said CVD TiN layer is formed in thickness of 200 Å through 500 Å.

* * * * *